US00RE34356E

United States Patent [19]

Hayakawa et al.

[11] E Patent Number: Re. 34,356

[45] Reissued Date of Patent: Aug. 24, 1993

[54] SEMICONDUCTOR LASER ARRAY

[75] Inventors: Toshiro Hayakawa, Nara; Takahiro Suyama, Tenri; Saburo Yamamoto, Nara, all of Japan

[73] Assignee: Sharp Kabushiki Kaisha, Osaka, Japan

[21] Appl. No.: 905,145

[22] Filed: Jun. 23, 1992

Related U.S. Patent Documents

Reissue of:

[64] Patent No.: 4,723,253
Issued: Feb. 2, 1988
Appl. No.: 730,747
Filed: May 6, 1985

U.S. Applications:

[63] Continuation of Ser. No. 390,511, Aug. 7, 1989, abandoned.

[30] Foreign Application Priority Data

May 10, 1984 [JP] Japan ..... 59-93986

[51] Int. Cl.[5] ..... H01S 3/19

[52] U.S. Cl. ..... 372/50; 372/45; 372/46; 372/48; 372/97; 257/79

[58] Field of Search ..... 357/17; 372/45, 46, 372/48, 50, 97, 98

[56] References Cited

U.S. PATENT DOCUMENTS 4,577,321 3/1986 Carney et al. ..... 372/50
4,603,421 7/1986 Scifres et al. ..... 372/46
4,806,994 2/1989 Hayakawa et al. ..... 357/4
4,835,783 5/1989 Suyama et al. ..... 372/46

FOREIGN PATENT DOCUMENTS 0010949 5/1980 European Pat. Off. .
0029167 5/1981 European Pat. Off. .
0045862 2/1982 European Pat. Off. .
0064339 11/1982 European Pat. Off. .

OTHER PUBLICATIONS

Applied Physics Letters, vol. 44, No. 2, Jan. 1954, pp. 157–159, "Longitudinal-Mode Control in Integrated Semiconductor Laser Phased Arrays by Phase Velocity Matching".

Xerox Disclosure Journal, vol. 4, No. 3 May/Jun. 1979, pp. 357–358, "Improved Leaky Mode Buried Heterostructure (B.H.) Injection Lasers".

Applied Physics Letters, vol. 42, No. 2, Jan. 15, 1983, pp. 152–154, "Single Longitudinal Mode Operation of High Power Multiple-Stripe Injection Lasers".

*Primary Examiner*—Frank Gonzalez

[57] ABSTRACT

A semiconductor laser array includes a plurality of stripe-shaped stimulated regions of the index guide type. A plurality of buried layers are disposed between each of the plurality of stripe-shaped stimulated regions. A light absorption layer is formed in each of the plurality of stripe-shaped stimulated regions so that the stimulated region has the optical loss greater than an buried layer, whereby optical coupling is performed with no phase difference.

31 Claims, 3 Drawing Sheets

FIG. 7
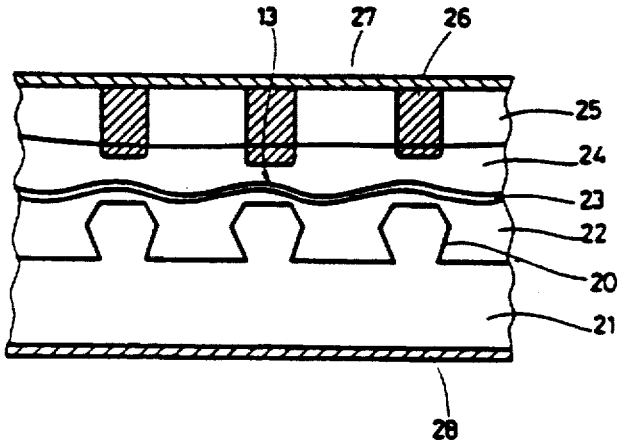
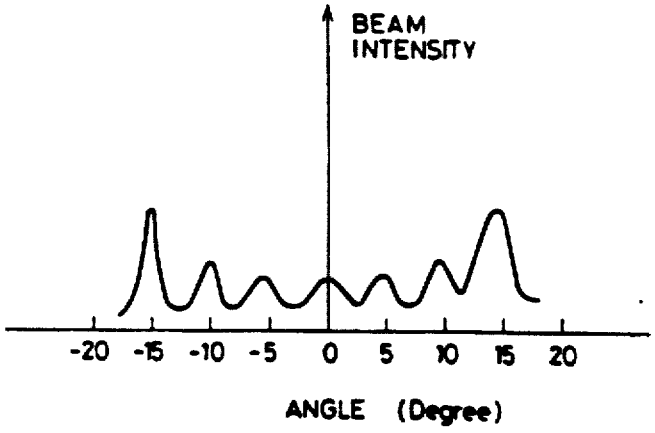
FIG. 8 PRIOR ART

SEMICONDUCTOR LASER ARRAY

Matter enclosed in heavy brackets [ ] appears in the original patent but forms no part of this reissue specification; matter printed in italics indicates the additions made by reissue.

*This application is a continuation of application Ser. No. 07/390,511 filed on Aug. 7, 1989, now abandoned, which is a Reissue of Ser. No. 06/730,747, now U.S. Pat. No. 4,723,253.*

BACKGROUND OF THE INVENTION

1. Field of the Invention

The present invention relates to a semiconductor laser and, more particularly, to a semiconductor laser array which includes a plurality of stripe-shaped stimulated regions. The plurality of stripe-shaped stimulated regions are phase-coupled to each other so that the laser beams are coupled to each other with a phase difference of zero degrees, thereby obtaining a high power laser beam.

2. Description of the Related Art

A semiconductor laser has widely been used as a light source in an optical information processing system such as an optical communication system and a digital audio disc system. Further, the semiconductor laser is widely used in an optical disc system wherein new information can be written into the optical memory disc through the use of a semiconductor laser, the output power of which is modulated in accordance with the information to be written into the optical memory disc. Rapid processing is required in such an optical information processing system as the amount of information to be handled increases. To ensure the rapid processing, the semiconductor laser must emit the laser beam at a high power level in a stable operating range. However, in the conventional semiconductor laser having a single stimulated region, the practical maximum output is about 40 mW.

To enhance the output level, a semiconductor laser array has been proposed, wherein a plurality of stimulated regions are aligned in a parallel fashion, and the plurality of stimulated regions are optically, phase coupled to each other so as to emit the laser beam in a single phase. This is referred to as a phase coupled laser array. The phase coupled semiconductor laser array is effective to converge the laser beams in a narrow radiation angle.

In the conventional semiconductor laser array of the gain guide type, the gain is substantially reduced at the coupling region positioned between two adjacent laser emitting regions and, therefore, the electric field has a phase difference of 180 degrees at two adjacent laser emitting regions. The far field pattern has a plurality of peaks as shown in FIG. 8. Thus, the conventional semiconductor laser array of the gain guide type cannot be of practical use.

To improve the above-mentioned problems, a semiconductor laser array of the index guide type has been proposed. For example, D. E. Ackley et al of Hewlett-Packard Laboratories proposed a semiconductor laser array of a buried heterostructure laser with a leaky mode (Appl. Phys. Letters, vol. 39, 1981, pp. 27). The proposed laser array ensures an effective coupling of the laser emitting regions, but has two peaks in the far field pattern because of the leaky mode.

D. Botez et al of RCA Laboratories proposed a CSP-LOC (Channeled-Substrate-Large-Optical-Capacity) laser (document of IOOC, 1983, 29B5-2). The proposed semiconductor laser utilizes the distribution of effective refractive index which is formed by a coupling to the GaAs substrate. The region disposed between two adjacent laser emitting regions has a high absorption coefficient. The refractive index difference is not obtained when the absorption coefficient is minimized. Accordingly, it is difficult to reduce the phase difference between two adjacent laser emitting regions to zero.

D. E. Ackley et al of Hewlett-Packard Laboratories further proposed the semiconductor laser array of the ridge-type (Appl. Phys. Letters, vol. 42, 1983, pp. 152). Each pair of adjacent laser emitting regions has a phase difference of 180 degrees of the high absorption caused by an electrode disposed at a coupling region of the adjacent laser emitting regions.

OBJECTS AND SUMMARY OF THE INVENTION

Objects of the Invention

Accordingly, an object of the present invention is to provide a semiconductor laser array which ensures a stable operation and a high power output.

Another object of the present invention is to provide a semiconductor laser array of the index guide type, wherein the laser emitting regions are coupled to each other with a phase difference of zero degrees.

Other objects and further scope of applicability of the present invention will become apparent from the detailed description given hereinafter. It should be understood, however, that the detailed description and specific examples, while indicating preferred embodiments of the invention, are given by way of illustration only, since various changes and modifications within the spirit and scope of the invention will become apparent to those skilled in the art from this detailed description.

Summary of the Invention

To achieve the above objects, pursuant to an embodiment of the present invention, a plurality of stripe-shaped stimulated regions are formed in a semiconductor substrate in a parallel fashion. An optical loss is added to each of the plurality of stimulated regions so that stripe-shaped stimulated region has an optical loss greater than that of the coupling regions disposed between adjacent stripe-shaped stimulated regions, whereby the phase difference between the adjacent stimulated regions is held at zero degrees. The laser emission is carried out at a high power level in a stable operating range.

BRIEF DESCRIPTION OF THE DRAWINGS

The present invention will be better understood from the detailed description given hereinbelow and the accompanying drawings which are given by way of illustration only, and thus are not limitative of the present invention and wherein:

FIG. 7 is a sectional view of another embodiment of a semiconductor laser array of the present invention; and FIG. 8 is a graph showing the far field pattern of a semiconductor laser array of the conventional gain guide type.

DESCRIPTION OF THE PREFERRED EMBODIMENTS

Figure 1:
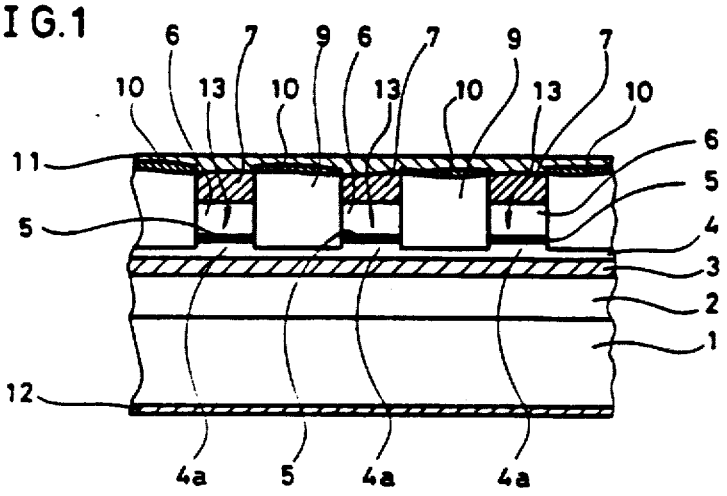
FIG. 1 is a sectional view of an embodiment of a semiconductor laser array of the present invention.

The semiconductor laser array of the present invention includes an n-GaAs substrate 1, and an n-$Ga_{0.6}Al_{0.4}As$ cladding layer 2 formed on the n-GaAs substrate 1. A p-$Ga_{0.9}Al_{0.1}As$ active layer 3 is formed on the n-$Ga_{0.6}Al_{0.4}As$ cladding layer 2, and a p-$Ga_{0.6}Al_{0.4}As$ cladding layer 4 is formed on the p-$Ga_{0.9}Al_{0.1}As$ active layer 3. Stripe-shaped thick portions 4a, each having a width of, for example, 3 μm, are formed in the p-$Ga_{0.6}Al_{0.4}As$ cladding layer 4 with a distance of, for example, 7 μm. On the thick portions 4a, a p-GaAs light absorption layer 5, a p-$Ga_{0.6}Al_{0.4}As$ cladding layer 6, and a p-GaAs cap layer 7 are formed.

An n-$Ga_{0.5}Al_{0.5}As$ buried layer 9 is formed on the p-$Ga_{0.6}Al_{0.4}As$ cladding layer 4 at the positions where the thick portions 4a are not formed, in a manner that the top surface of the n-$Ga_{0.5}Al_{0.5}As$ buried layer 9 substantially has the same height as the top surface of the p-GaAs cap layer 7. An oxide film 10 is formed on the top surface of the n-$Ga_{0.5}Al_{0.5}As$ buried layer 9. A Cr/Au electrode 11 commonly formed on the p-GaAs cap layer 7 and the oxide film 10. An AuGe/Ni electrode 12 is formed on the bottom surface of the n-GaAs substrate 1. The n-$Ga_{0.6}Al_{0.4}As$ cladding layer 2, p-$Ga_{0.9}Al_{0.1}As$ active layer 3, p-$Ga_{0.6}Al_{0.4}As$ cladding layer 4, p-GaAs light absorption layer 5, p-$Ga_{0.6}Al_{0.4}As$ cladding layer 6, and p-GaAs cap layer 7 form, in combination, stripe-shaped stimulated regions 13.

The p-GaAs light absorption layer 5 and the p-$Ga_{0.6}Al_{0.4}As$ cladding layer 6 in each stripe-shaped stimulated region 13 have the greater refractive index than the n-$Ga_{0.5}Al_{0.5}As$ buried layer 9, thereby forming the semiconductor laser of the index guide type. Each of the stripe-shaped stimulated regions 13 includes the p-GaAs light absorption layer 5 and, therefore, the optical loss in the stripe-shaped stimulated regions 13 is greater than that in the n-$Ga_{0.5}Al_{0.5}As$ buried layer 9. With this structure, the optical loss in the n-$Ga_{0.5}Al_{0.5}As$ buried layer 9 is small as compared with the optical loss in the stripe-shaped stimulated regions 13 and, therefore, the laser beams generated from each of the stripe-shaped stimulated regions 13 are coupled to each other with no phase difference in a stable operational mode.

Manufacturing steps of the semiconductor laser array of FIG. 1 will be described with reference of FIGS. 2, 3, 4 and 5.

Figure 2:
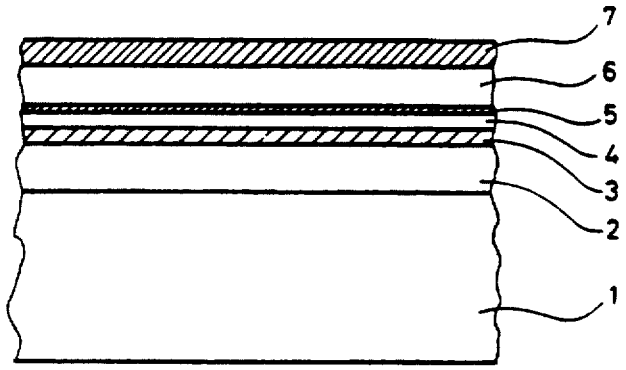
FIGS. 2,3,4 and 5 are sectional views for explaining manufacturing steps of the semiconductor laser array of FIG. 1.

The n-$Ga_{0.6}Al_{0.4}As$ cladding layer 2 of 1 μm thick, the p-$Ga_{0.9}Al_{0.1}As$ active layer 3 of 0.1 μm thick, the p-$Ga_{0.6}Al_{0.4}As$ cladding layer 4 of 0.3 μm thick, the p-GaAs light absorption layer 5 of 0.05 μm thick, the p-$Ga_{0.6}Al_{0.4}As$ cladding layer 6 of 0.7 μm thick, and the p-GaAs cap layer 7 of 0.3 μm thick are sequentially formed on the n-GaAs substrate 1 through the use of the liquid-phase epitaxial growth method as shown in FIG. 2.

Figure 3:
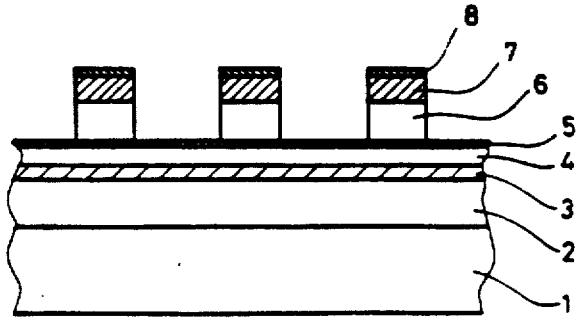

Then, stripe-shaped resists 8 are formed on the p-GaAs cap layer 7 through the use of the photolighography technique. The thus formed resists 8 function as the masks in the following etching operation. The p-GaAs cap layer 7 and the p-$Ga_{0.6}Al_{0.4}As$ cladding layer 6 are removed by the etching method at the position where the stripe-shaped resists 8 are not formed, as shown in FIG. 3. The etching operation first uses an etchant consisting of $H_2SO_4$, $H_2O_2$ and $H_2O$ ($H_2SO_4$:$H_2O_2$:$H_2O$=10:1:1) which is capable of etching both GaAs and GaAlAs evenly. The etching operation is conducted to a depth that at least reaches the p-$Ga_{0.6}Al_{0.4}As$ cladding layer 6. Thereafter, the etching operation is carried out through the use of hydrofluoric acid (HF), which is capable of selectively etching GaAlAs, to etch the remaining p-$Ga_{0.6}Al_{0.4}As$ cladding layer 6.

Figure 4:
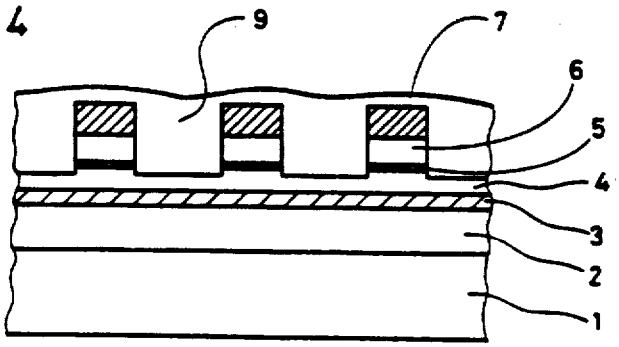

After completion of the etching operation, the stripe-shaped resists 8 are removed, and a meltback etching using an unsaturated solution is carried out in a liquid-phase growth board. The p-GaAs light absorption layer 5 is removed at the positions where the p-$Ga_{0.6}Al_{0.4}As$ cladding layer 6 is removed by the preceding etching operation. The meltback etching is carried out to the depth where the p-$Ga_{0.6}Al_{0.4}As$ cladding layer 4 is slightly removed. Then, the n-$Ga_{0.5}Al_{0.5}As$ buried layer 9 is formed on the semiconductor body as shown in FIG. 4. In a preferred form, each of the stripe-shaped resists 8 has the width of 3 μm, and the stripe-shaped resists 8 are formed with a pitch of 7 μm.

Figure 5:
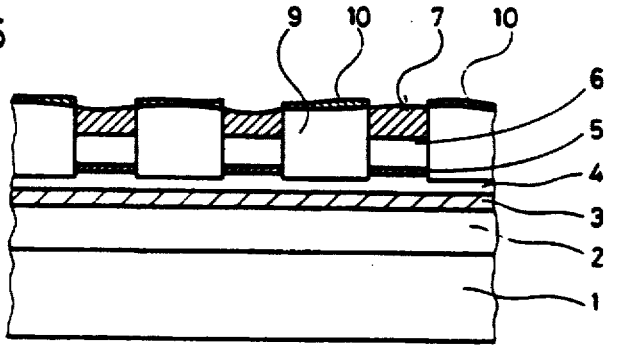

An etching operation is carried out to the depth at which the p-GaAs cap layer 7 appears as shown in FIG. 5 through the use of hydrofluoric acid (HF) diluted by acetic acid. The native oxide 10 is formed on the n-$Ga_{0.5}Al_{0.5}$. As buried layer 9 while the etching operation is conducted. Finally, the Cr/Au electrode 11 is formed on the p-GaAs cap layer 7 and the native oxide 10. Further, the AuGe/Ni electrode 12 is formed on the bottom surface of the n-GaAs substrate 1.

Figure 6:
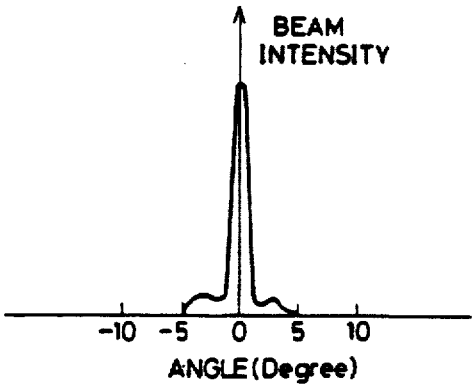
FIG. 6 is a graph showing the far field pattern obtained by the semiconductor laser array of FIG. 1.

FIG. 6 shows the far field pattern when a semiconductor laser array of the above-mentioned structure and having seven (7) stripe-shaped stimulated regions 13 is driven at the threshold current of 210 mA, and the output power above 100 mW. The single peak far field pattern indicates a stable operation of the semiconductor laser array of the present invention.

In the foregoing embodiment, the n-$Ga_{0.5}Al_{0.5}As$ buried layer 9 function to confine the electric current in the stripe-shaped stimulated regions 13. In order to increase the gain, a p-$Ga_{0.5}Al_{0.5}As$ buried layer can be employed. In this case, the native oxide 10 functions to confine the electric current in the stripe-shaped stimulated regions 13. If the layers shown in FIG. 2 are formed by, for example, the MBE method or the MOCVD method, which ensures fine control of the layer thickness, instead of the liquid-phase epitaxial growth method, the index difference and the loss difference can be accurately controlled between the stripe-shaped stimulated regions 13, including the p-GaAs light absorption layer 5 and the p-$Ga_{0.6}Al_{0.4}As$ cladding layer 6, and the n-$Ga_{0.5}Al_{0.5}As$ buried layer 9.

FIG. 7 shows another embodiment of a semiconductor laser array of the present invention.

Mesas 20, each having a predetermined width, are formed on an n-GaAs substrate 21 with a predetermined pitch. An n-$Ga_{0.7}Al_{0.3}As$ cladding layer 22, a p-GaAs active layer 23, a p-$Ga_{0.7}Al_{0.3}As$ cladding layer 24, and an n-GaAs cap layer 25 are sequentially formed on the n-GaAs substrate 21. A Zn diffusion is conducted to the portions corresponding to the mesas 20 to reach the p-$Ga_{0.7}Al_{0.3}As$ cladding layer 24, thereby forming current paths 26. A first electrode 27 is formed on the n-GaAs cap layer 25, and a second electrode 28 is formed on the bottom surface of the n-GaAs substrate 21.

The thickness of the p-GaAs active layer 23 varies depending on the provision of the mesas 20. More specifically, the thickness of the p-GaAs active layer 23 is maximum at the center of the mesa 20, and is minimum between the mesas 20. Accordingly, the stripe-shaped stimulated regions 13 of the index guide type are formed above the mesas 20. The n-$Ga_{0.7}Al_{0.3}As$ cladding layer 22 is thin, for example, about 0.5 μm, at the center of the mesas 20 so as to increase the optical loss in the strip-shaped stimulated regions 13 by absorbing the laser beam by the n-GaAs substrate 21 via the mesas 20.

The semiconductor laser array of FIG. 7 is manufactured in the following manner. The mesas 20 are formed on the n-GaAs substrate 21 through the use of the photolithography method and the chemical etching method. Each of the mesa 20 preferably has the width of about 2.5 μm, and the height of about 1 μm. The n-$Ga_{0.7}Al_{0.3}As$ cladding layer 22 is formed on the n-GaAs substrate 21 by the liquid-phase epitaxial growth method. The n-$Ga_{0.7}Al_{0.3}As$ cladding layer 22 has the thickness of about 0.5 μm at the center of the mesas 20. Then, the p-GaAs active layer 23 is formed on the n-$Ga_{0.7}Al_{0.3}$ As cladding layer 22 by the liquid-phase epitaxial growth method. The p-GaAs active layer 23 has a thickness of about 0.12 μm at the center of the mesas 20. The cladding layer 24 having a thickness of about 1 μm, and the n-GaAs cap layer 25 having a thickness of about 0.5 μm are sequentially formed by the liquid-phase epitaxial growth method. Then, the Zn diffusion is conducted at the position corresponding to the mesas 20 so that the Zn diffusion reaches the cladding layer 24, thereby forming the current paths 26. Finally, the electrode 27 is formed on the n-GaAs cap layer 25, and the electrode 28 is formed on the bottom surface of the n-GaAs substrate 21.

The present invention is applicable to an InGaAsP semiconductor laser or an InGaAlP semiconductor laser in addition to the GaAlAs semiconductor laser.

The invention being thus described, it will be obvious that the same may be varied in many ways without departure from the spirit and scope of the invention, which is limited only by the following claims.

What is claimed is:

1. A semiconductor element in a semiconductor laser array comprising:

a semiconductor substrate;

a plurality of stripe-shaped stimulated regions of an index guide type formed on said semiconductor substrate;

a plurality of buried layers, a buried layer being disposed between adjacent ones of said plurality of stripe-shaped stimulated regions, wherein said plurality of stripe-shaped stimulated regions comprise a light absorption layer so that said plurality of stripe-shaped stimulated regions have an optical loss greater than an optical loss of said plurality of buried layers;

a first electrode formed commonly on said plurality of stripe-shaped stimulated regions; and a second electrode formed on a bottom surface of said semiconductor substrate.

2. A semiconductor laser array comprising:

a semiconductor substrate;

a first cladding layer formed on said semiconductor substrate;

an active layer formed on said first cladding layer;

a second cladding layer formed on said active layer;

a plurality of stripe-shaped stimulated regions formed on said second cladding layer, each of said plurality of stripe-shaped stimulated regions including:

a light absorption layer formed on said second cladding layer;

a third cladding layer formed on said light absorption layer; and a cap layer formed on said third cladding layer:

a plurality of buried layers disposed between each of said plurality of stripe-shaped stimulated regions;

a plurality of oxide films formed on each of said plurality of buried layers;

a first electrode formed commonly on said plurality of stripe-shaped stimulated regions and said plurality of oxide films; and a second electrode formed on the bottom surface of said semiconductor substrate.

3. A GaAlAs semiconductor laser array comprising:

an n-GaAs substrate;

An n-$Ga_{0.6}Al_{0.4}As$ cladding layer formed on said n-GaAs substrate;

a p-$Ga_{0.9}Al_{0.1}As$ active layer formed on said n-$Ga_{0.6}Al_{0.4}As$ cladding layer;

a p-$Ga_{0.6}Al_{0.4}As$ cladding layer formed on said p-$Ga_{0.9}Al_{0.1}As$ active layer;

a plurality of stripe shaped stimulated regions formed on said p-$Ga_{0.6}Al_{0.4}As$ cladding layer, each of said plurality of stripe-shaped stimulated regions including:

p-GaAs light absorption layer formed on said p-$Ga_{0.6}Al_{0.4}As$ cladding layer;

a p-$Ga_{0.6}Al_{0.4}As$ cladding layer formed on said p-GaAs light absorption layer; and a p-GaAs cap layer formed on said p-$Ga_{0.6}Al_{0.4}As$ cladding layer;

a plurality of n-$Ga_{0.5}Al_{0.5}As$ buried layers disposed between each of said plurality of stripe-shaped stimulated regions;

a plurality of oxide films formed on each of said plurality of n-$Ga_{0.5}AL_{0.5}As$ buried layers;

a first electrode formed commonly on said plurality of stripe-shaped stimulated regions and said plurality of oxide films; and a second electrode formed on the bottom surface of said n-GaAs substrate.

4. The semiconductor element of claim 1 wherein each of said plurality of stripe-shaped stimulated regions formed on said semiconductor substrate further comprise:

a cladding layer disposed on said light absorption layer; and a cap layer formed on said cladding layer.

5. The semiconductor element of claim 4 further comprising a plurality of oxide films each oxide film being disposed on one of said plurality of buried layers.

6. The semiconductor laser array of claim 2 wherein said third cladding layer has a refractive index greater than each of said plurality of buried layers.

7. The semiconductor laser array of claim 2 wherein each of said stripe-shaped stimulated regions have an optical loss greater than an optical loss of said plurality of buried layers.

8. The semiconductor laser array of claim 2 wherein each of said plurality of buried layers includes n-$Ga_{0.5}Al_{0.5}As$.

9. The semiconductor laser array of claim 2 wherein each of said plurality of buried layers includes p-$Ga_{0.5}Al_{0.5}As$.

*10. A semiconductor laser device comprising:*

*a semiconductor substrate;*

*first cladding layer formed on said semiconductor substrate;*

*an active layer formed on said first cladding layer;*

*a second cladding layer formed on said active layer and having an area coextensive with a portion of said active layer;*

*a light absorption layer formed on said second cladding layer over said coextensive area;*

*a third cladding layer formed on and coextensive with said light absorption layer;*

*a cap layer formed on and coextensive with said third cladding layer; and*

*a buried layer formed on said second cladding layer of a thickness subtending said light absorption layer, said third cladding layer and said cap layer.*

*11. The laser device of claim 10, wherein said light absorption layer and said third cladding layer have a refractive index greater than that of said buried layer.*

*12. The laser device of claim 10, which further includes a first electrode layer on said substrate opposite said first cladding layer; and*

*a second electrode layer on said cap layer.*

*13. The laser device of claim 12, wherein said third cladding layer has a refractive index greater than that of said buried layer.*

*14. The laser device of claim 10, wherein said coextensive area of said second cladding layer is of equal or greater thickness than the remainder thereof.*

*15. The laser device of claim 14, wherein said light absorption layer and said third cladding layer have a refractive index greater than that of said buried layer.*

*16. The laser device of claim 14, which further includes a first electrode layer on said substrate opposite said first cladding layer; and*

*a second electrode layer on said cap layer.*

*17. The laser device of claim 16, wherein said third cladding layer has a refractive index greater than that of said buried layer.*

*18. A semiconductor laser device comprising:*

*a semiconductor substrate of n-GaAs;*

*a first cladding layer of n-$Ga_{0.6}Al_{0.4}As$ formed on said substrate;*

*an active layer of p-$Ga_{0.9}Al_{0.1}As$ formed on said first cladding layer;*

*a second cladding layer of p-$Ga_{0.6}Al_{0.4}As$ formed on said active layer and having an area coextensive with a portion of said active layer;*

*a light absorption layer of p-GaAs formed on said second cladding layer over said coextensive area;*

*a third cladding layer of p-$Ga_{0.6}Al_{0.4}As$ formed on and coextensive with said light absorption layer;*

*a cap layer of p-GaAs formed on and coextensive with said third cladding layer; and*

*a buried layer of n-$Ga_{0.5}Al_{0.5}As$ formed on said second cladding layer of a thickness subtending said light absorption layer, said third cladding layer and said cap layer.*

*19. The laser device of claim 18, which further includes a first electrode layer on said substrate opposite said first cladding layer; and*

*a second electrode layer on said cap layer.*

*20. The laser device of claim 18, wherein said coextensive area of said second cladding layer is of equal or greater thickness than the remainder thereof.*

*21. The laser device of claim 20, which further includes a first electrode layer on said substrate opposite said first cladding layer; and*

*a second electrode layer on said cap layer.*

*22. The method of manufacturing a semiconductor laser device comprising the steps of:*

*providing a substrate of semiconductor material;*

*sequentially forming a first cladding layer on said substrate, an active layer on said first cladding layer, a second cladding layer on said active layer, a light absorption layer on said second cladding layer, a third cladding layer on said light absorption layer and a cap layer on said third cladding layer;*

*forming a mask on said cap layer;*

*applying a first etchant to said cap layer to remove the unmasked portions of said cap layer and at least some of the corresponding portions of said third cladding layer;*

*applying a second etchant to said third cladding layer to remove the remainder of said corresponding portions and expose said light absorption layer;*

*applying a third etchant to said light absorption layer to remove portions thereof corresponding to removed portions of said third cladding layer down to said second cladding layer;*

*removing said mask;*

*forming a buried layer on said cladding layer to a depth at least subtending the combined thickness of said light absorption layer, said third cladding layer and said cap layer; and*

*applying a fourth etchant to said buried layer and said cap layer to reduce the thickness of said cap layer.*

*23. The method of claim 22, which further includes the steps of:* forming a first electrode on said cap layer; and forming a second electrode on said semiconductor substrate opposite said first cladding layer.

*24. The method of claim 22, which further includes utilizing said third etchant to remove some of said second cladding layer, leaving a thicker portion thereof in the shape of said mask overlying said active layer.*

*25. The method of claim 24, which further includes the steps of:*

*forming a first electrode on said cap layer and said oxide layer; and*

*forming a second electrode on said semiconductor substrate opposite said first cladding layer.*

*26. The method of manufacturing a semiconductor laser array comprising the steps of:*

*providing a substrate of semiconductor material;*

*sequentially forming a first cladding layer on said substrate, an active layer on said first cladding layer, a second cladding layer on said active layer, a light absorption layer on said second cladding layer, a third cladding layer on said light absorption layer and a cap layer on said third cladding layer;*

*forming a mask on said cap layer comprising a plurality of parallel stripe-shaped resists;*

*applying a first etchant to said cap layer to remove the unmasked portions of said cap layer and at least some of the corresponding portions of said third cladding layer;*

*applying a second etchant to said third cladding layer to remove the remainder of said corresponding portions and expose said light absorption layer;*

*applying a third etchant to said light absorption layer to remove portions thereof corresponding to removed portions of said third cladding layer down to said second cladding layer;*

*removing said mask;*

*forming a buried layer on said second cladding layer to a depth at least subtending the combined thickness of said light absorption layer, said third cladding layer and said cap layer; and applying a fourth etchant to said buried layer and said cap layer to reduce the thickness of said cap layer.*

*27. The method of claim 26, which further includes the steps of:*

*forming a first electrode on said cap layer; and*

*forming a second electrode on said semiconductor substrate opposite said first cladding layer.*

*28. The method of claim 26, which further includes utilizing said third etchant to remove some of said second cladding layer, leaving a thicker portion thereof in the shape of said mask overlying said active layer.*

*29. The method of claim 28, which further includes the steps of:*

*forming a first electrode on said cap layer; and*

*forming a second electrode on said semiconductor substrate opposite said first cladding layer.*

*30. The method of manufacturing a semiconductor laser device comprising the steps of:*

*providing a substrate of semiconductor material;*

*sequentially forming a first cladding layer on said substrate, an active layer on said first cladding layer, a second cladding layer on said active layer, a light absorption layer on said second cladding layer, a third cladding layer on said light absorption layer and a cap layer on said third cladding layer;*

*forming a mask on said cap layer;*

*applying a first etchant to said cap layer to remove the unmasked portions of said cap layer and at least some of the corresponding portions of said third cladding layer;*

*applying a second etchant to said third cladding layer to remove the remainder of said corresponding portions and expose said light absorption layer;*

*etching said light absorption layer to remove portions thereof corresponding to removed portions of said third cladding layer down to said second cladding layer;*

*removing said mask;*

*forming a buried layer on said cladding layer to a depth at least subtending the combined thickness of said light absorption layer, said third cladding layer and said cap layer; and*

*applying a third etchant to said buried layer and said cap layer to reduce the thickness of said cap layer.*

*31. The method of claim 30 wherein said light absorption layer is etched by a meltback etching technique.*

* * * * .*